(12) United States Patent
Tornila Oliver et al.

(10) Patent No.: US 12,326,748 B2
(45) Date of Patent: Jun. 10, 2025

(54) LINEAR VOLTAGE REGULATOR USING SERIAL BIT STREAM FOR VOLTAGE REGULATION

(71) Applicant: NXP B.V., Eindhoven (NL)

(72) Inventors: Jaume Tornila Oliver, Eindhoven (NL); Marco Lammers, Neerkant (NL)

(73) Assignee: NXP B.V., Eindhoven (NL)

( * ) Notice: Subject to any disclaimer, the term of this patent is extended or adjusted under 35 U.S.C. 154(b) by 296 days.

(21) Appl. No.: 17/650,569

(22) Filed: Feb. 10, 2022

(65) Prior Publication Data
US 2023/0251679 A1    Aug. 10, 2023

(51) Int. Cl.
G05F 1/575    (2006.01)
H03M 3/00    (2006.01)

(52) U.S. Cl.
CPC ............. *G05F 1/575* (2013.01); *H03M 3/30* (2013.01)

(58) Field of Classification Search
CPC .......... G05F 1/462; G05F 1/465; G05F 1/468; G05F 1/56; G05F 1/575; G05F 1/562; G05F 1/565; G05F 1/567; G05F 1/569; G05F 1/571; G05F 1/573; G05F 1/5735
See application file for complete search history.

(56) References Cited

U.S. PATENT DOCUMENTS

| | | | | |
|---|---|---|---|---|
| 6,438,005 | B1 * | 8/2002 | Walter | H02M 3/07 363/60 |
| 6,822,595 | B1 * | 11/2004 | Robinson | H03M 1/70 341/143 |
| 7,208,919 | B2 | 4/2007 | May | |
| 8,913,762 | B2 * | 12/2014 | Steele | G01D 5/24 341/110 |
| 9,857,814 | B2 * | 1/2018 | Cohen | G01K 7/00 |
| 10,126,769 | B2 | 11/2018 | Xu et al. | |
| 2002/0097175 | A1 * | 7/2002 | Wong | H03M 3/50 341/144 |
| 2005/0237233 | A1 * | 10/2005 | Muhammad | H03M 3/396 341/143 |

(Continued)

FOREIGN PATENT DOCUMENTS

EP    2887543 A1 *    6/2015    ............. H03F 3/217

OTHER PUBLICATIONS

Cheah, M., "A 100-mA, 99.11% Current Efficiency, 2-mVpp Ripple Digitally Controlled LDO With Active Ripple Suppression" IEEE Transactions on Very Large Scale Integration (VLSI) Systems, vol. 25, No. 2, Feb. 2017.

(Continued)

*Primary Examiner* — Sean Kayes
*Assistant Examiner* — Nusrat Quddus
(74) *Attorney, Agent, or Firm* — David G. Dolezal

(57) ABSTRACT

A linear voltage regulator includes a converter circuit that provides a serial bitstream having a pulse density that is indicative of a difference between a regulated voltage of the linear voltage regulator and a reference voltage. The linear voltage regulator also includes a digital to analog converter circuit that includes an input to receive the serial bitstream. The digital to analog converter circuit includes an averager circuit that produces an output signal to control a voltage of a control terminal of a power transistor of the linear voltage regulator for regulating the regulated voltage based on the pulse density of the serial bitstream.

14 Claims, 7 Drawing Sheets

(56) References Cited

U.S. PATENT DOCUMENTS

| | | | | |
|---|---|---|---|---|
| 2006/0261794 | A1* | 11/2006 | May | H02M 3/157 |
| | | | | 323/283 |
| 2007/0290894 | A1* | 12/2007 | Ng | H02M 3/157 |
| | | | | 341/50 |
| 2012/0153917 | A1* | 6/2012 | Adell | H02M 3/1588 |
| | | | | 323/283 |
| 2016/0054747 | A1* | 2/2016 | Cohen | H02M 3/07 |
| | | | | 713/300 |
| 2016/0202715 | A1* | 7/2016 | Petrov | G05F 1/56 |
| | | | | 323/280 |
| 2017/0284825 | A1* | 10/2017 | Lesso | H04R 3/06 |
| 2022/0035392 | A1 | 2/2022 | Kazarians et al. | |
| 2022/0247367 | A1* | 8/2022 | Melanson | H03F 3/45475 |
| 2023/0195151 | A1* | 6/2023 | Sorace | G05F 1/59 |
| | | | | 323/234 |

OTHER PUBLICATIONS

Jackum, T., "A Digitally Controlled Linear Voltage Regulator in a 65nm CMOS Process", 2010 17th IEEE International Conference on Electronics, Circuits and Systems, Dec. 12-15, 2010.

Redoute, J., "EMC of Analog Integrated Circuits", Springer Science & Business Media, e-ISBN 978-90-481-3230-0, 2010 (no month available).

Wikipedia, "Pulse-density modulation", URL:https://web.archive.org/web/2019032800 1620/https://en.wikipedia.org/wiki/Pulse-density_modulation; Retrieved from the Internet: Jul. 21, 2023.

* cited by examiner

LINEAR VOLTAGE REGULATOR USING SERIAL BIT STREAM FOR VOLTAGE REGULATION

BACKGROUND OF THE INVENTION

Field of the Invention

This invention relates in general to linear voltage regulators.

Background

Some types of linear voltage regulators include a power transistor that includes one current terminal coupled to a supply voltage terminal and a second current terminal to provide a regulated voltage. The voltage provided at the second terminal is dependent upon the voltage applied to the control terminal of the power transistor.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a linear voltage regulator includes a converter circuit that provides a serial bitstream having a pulse density that is indicative of a difference between a regulated voltage of the linear voltage regulator and a reference voltage. The linear voltage regulator also includes a digital to analog converter circuit that includes an input to receive the serial bitstream. The digital to analog converter circuit includes an averager circuit that produces an output signal to control a voltage of a control terminal of a power transistor of the linear voltage regulator for regulating the regulated voltage based on the pulse density of the serial bitstream.

In some embodiments, providing a converter circuit that produces a serial bitstream having a pulse density that is indicative of an error voltage to a digital to analog converter with an averager circuit to provide an output signal to control the voltage of a control terminal of a power transistor may allow for the converter circuit and the digital to analog converter to be designed and implemented separate from each other so as to tailor each circuit to a different voltage domain. Such design flexibility may allow for changes in one of the two circuits without significantly affecting the other circuit. In one embodiment, implementing a serial bitstream to convey error information to the digital to analog converter circuit may allow for a reduction in complexity of the regulator in that only one level shifting circuit is utilized instead of multiple level shifting circuits. Furthermore, the converter circuit may be implemented with lower voltage devices in some embodiments thereby reducing the total area of the circuit and reducing the power consumption of the circuit.

Figure 1:
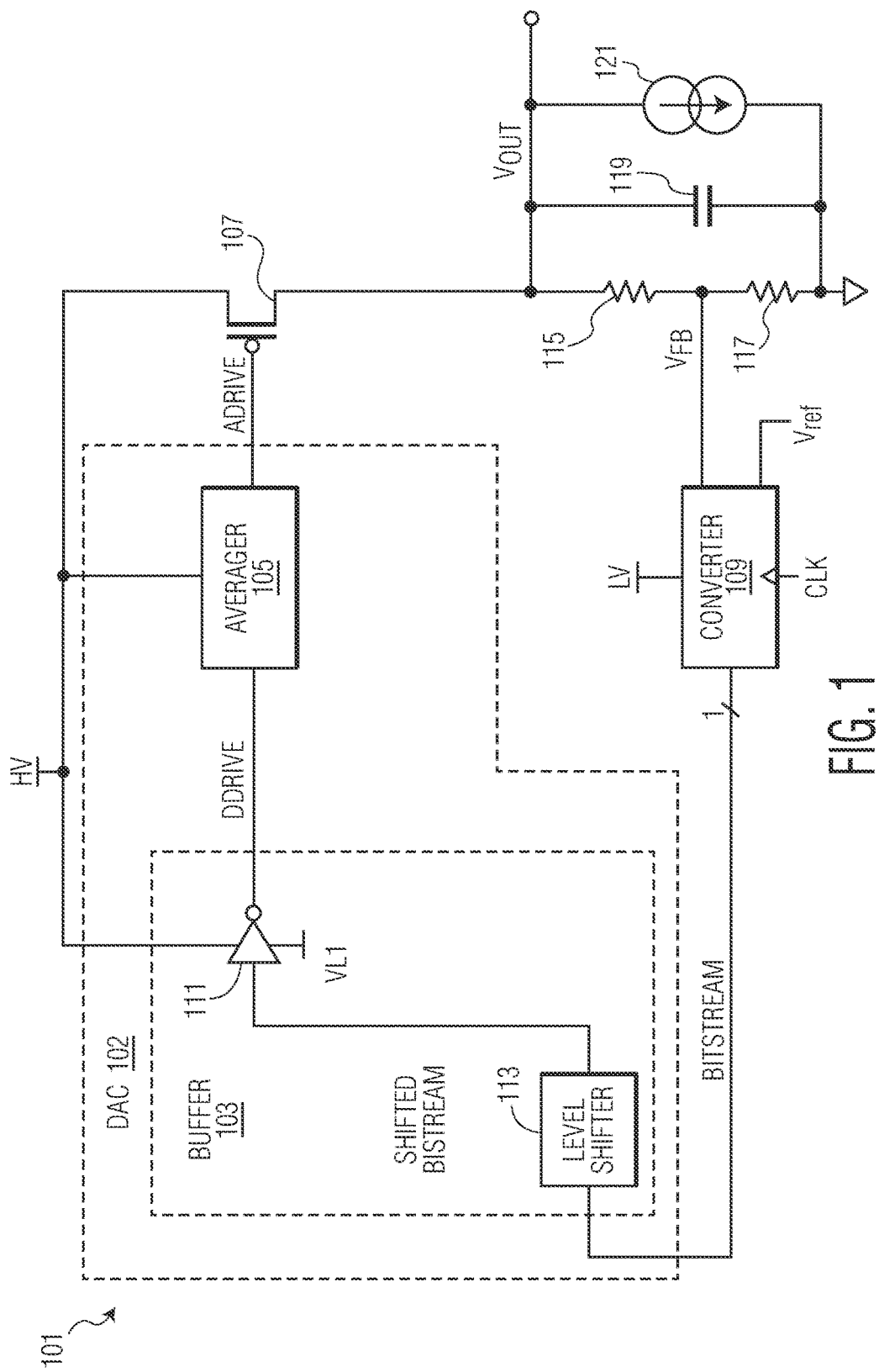
FIG. 1 is a circuit diagram of a linear voltage regulator according to one embodiment of the present invention.

FIG. 1 is a circuit diagram of a linear voltage regulator 101 according to one embodiment of the present invention. Regulator 101 includes a power transistor 107, which in the embodiment shown, is implemented with a P-type field effect transistor (FET). In other embodiments, transistor 107 may be implemented with other types of power transistors such as an N-type FET or bipolar transistor implemented in BiCMOS technology. The source of transistor 107 is connected a high supply voltage terminal for supplying a high supply voltage (HV) for a first voltage domain. The drain of transistor 107 supplies a regulated voltage ($V_{OUT}$) to a load (e.g., represented as current source 121). In one embodiment, transistor 107 is biased for operation in an ohmic region where the voltage at the gate of transistor 107 (signal ADRIVE) controls the voltage of $V_{OUT}$. Smoothing capacitor 119 is located at the output of regulator 101.

Regulator 101 includes a converter circuit 109 that receives a feedback voltage ($V_{FB}$) from a voltage divider of resistors 115 and 117 that is indicative of the regulated voltage $V_{OUT}$. Converter circuit 109 produces a serial bitstream (BITSTREAM) having a pulse density that is indicative of a voltage difference between the regulated voltage (as indicated by $V_{FB}$) and $V_{REF}$. Converter circuit 109 receives a high supply voltage (LV) of a lower voltage domain where LV is at a lower voltage than HV. A serial bitstream is a series of digital pulses conveyed serially. In some embodiments, converter circuit does not include a level shifter.

Regulator 101 includes a digital to analog converter (DAC 102) that converters the serial bitstream to an analog control signal (ADRIVE) that is applied to the gate of transistor 107 to control the conductivity of transistor 107 such that $V_{OUT}$ tries to match $V_{REF}$ in response to changing load conditions of the output (represented by current source 121). In the embodiment shown, DAC 102 includes a buffer circuit 103 that includes a level shifter 113 for shifting the serial bitstream from the voltage domain of high supply voltage LV to the voltage domain of high supply voltage HV to produce a level shifted bitstream (SHIFTED BITSTREAM). In the embodiment shown, buffer circuit 103 includes an inverter 111 that inverts the shifted bitstream and provides drive current to produce digital signal DDRIVE. In the embodiment shown, the high supply voltage terminal of inverter 111 is biased at voltage HV and the low supply voltage terminal of inverter 111 is biased at a lower voltage VL1. In one embodiment, VL1 is above ground (e.g. 0.3V)

and is set at the lower range to bias transistor 107 in the ohmic range. In some embodiments, a buffer may be used instead of an inverter for providing drive current.

DAC 102 includes an averager circuit 105 that converters the digital DDRIVE signal into an analog signal ADRIVE that controls the conductivity of transistor 107. An averager circuit is a circuit that removes a high frequency content of a signal and maintains a low frequency content of the signal. In some embodiments, averager circuit 105 provides a "smoother" signal at the output which acts to reduce voltage ripple at the gate of power transistor 107.

Figure 2:
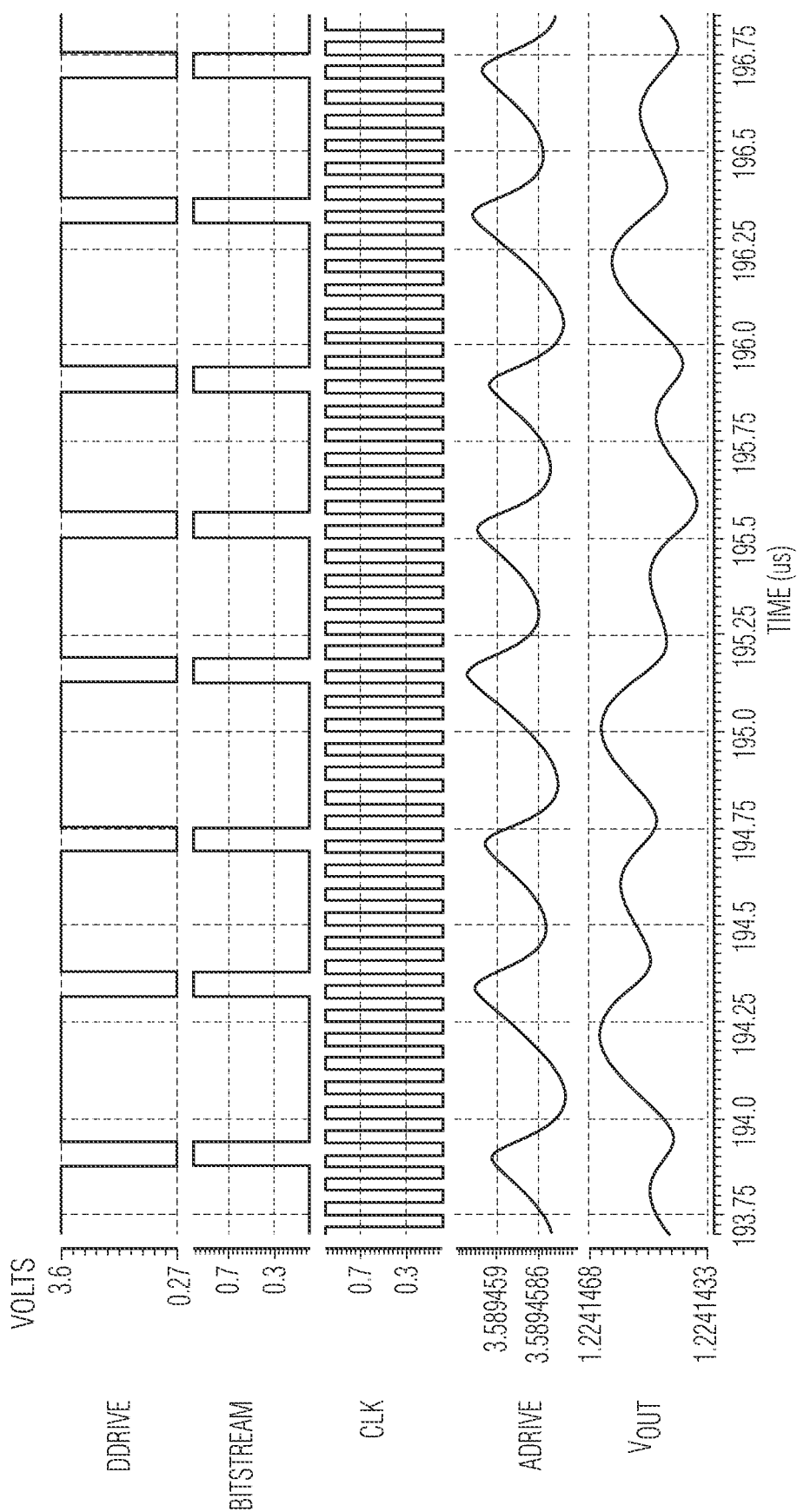
FIG. 2 is a timing diagram of signals of a linear voltage regulator during operation according to one embodiment of the present invention.

FIG. 2 shows a timing diagram of the operation of regulator 101 according to one embodiment. Converter circuit 109 compares the feedback voltage $V_{FB}$ with the reference voltage $V_{REF}$ and produces a bitstream (BITSTREAM) whose pulse density is dependent upon the difference between $V_{FB}$ and $V_{REF}$. As shown in FIG. 2, BITSTREAM is a series of pulses having a high voltage signal state of LV (e.g., 1.0 volts) and a low voltage signal state of ground. The pulse density of a digital signal is the proportion of time that the signal is at one signal state (e.g., 1 volt in FIG. 2) versus the proportion of time that the signal is at another signal state (e.g., ground in FIG. 2). For pulse width modulated signals where the bitstream is periodic, the pulse density is the duty cycle of the pulse width modulated signal. The pulse density of BITSTREAM is dependent upon the relationship between $V_{REF}$ and $V_{FB}$. In the embodiment shown in FIGS. 1 and 2, if $V_{REF}$ is higher than $V_{FB}$, then BITSTREAM has a higher pulse density than if $V_{REF}$ is lower than $V_{FB}$. In some embodiments, the pulse density of BITSTREAM is proportional to the difference between $V_{REF}$ and $V_{FB}$. In the embodiment shown, converter circuit 109 receives a clock signal (CLK) that has a higher frequency than BITSTREAM.

Level shifter 113 shifts BITSTREAM to a higher voltage domain where inverter 111 inverts the level shifted BITSTREAM to produce DDRIVE. In some embodiments, level shifter 113 may also logically invert the BITSTREAM. In the embodiment shown, DDRIVE has a high voltage state of HV (e.g., 3.6 volts) and a low voltage state of VL1 (e.g., 0.3 volts). Averager circuit 105 receives DDRIVE and produces a relatively smooth ADRIVE that controls the conductivity of power transistor 107, and thus the voltage of $V_{OUT}$. The voltage value of ADRIVE is dependent upon the pulse density of DDRIVE. In the embodiment shown, the greater percentage of time that DDRIVE is at the high voltage state, the higher the voltage ADRIVE will be, which lowers the conductivity of transistor 107 to lower $V_{OUT}$. However, the greater the percentage of time that DDRIVE is at the low voltage state, the lower the voltage ADRIVE will be, which increases the conductivity of transistor 107 and raises $V_{OUT}$.

Although FIG. 2 seems to show a high variation in ADRIVE and $V_{OUT}$, the scale of those two signals in FIG. 2 is very large. In FIG. 2, ADRIVE only varies by 0.000001 volts and $V_{OUT}$ only varies by 0.000003 volts. In other embodiments linear voltage regulator 101 may operate in other ways, include other devices, and/or have other configurations.

Figure 3:
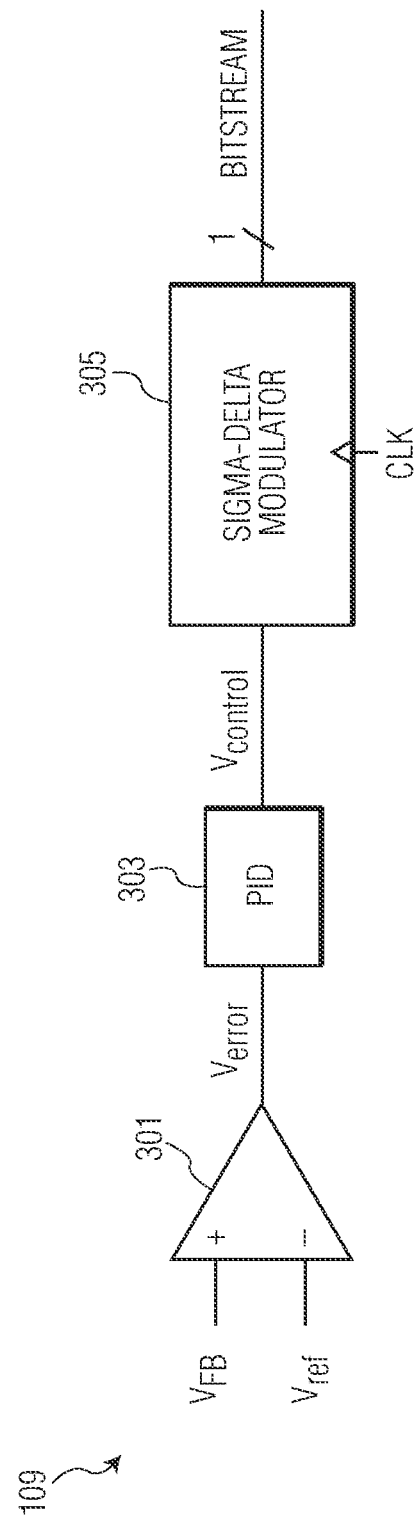
FIG. 3 is a circuit diagram of a converter circuit according to one embodiment of the present invention.
Figure 4:
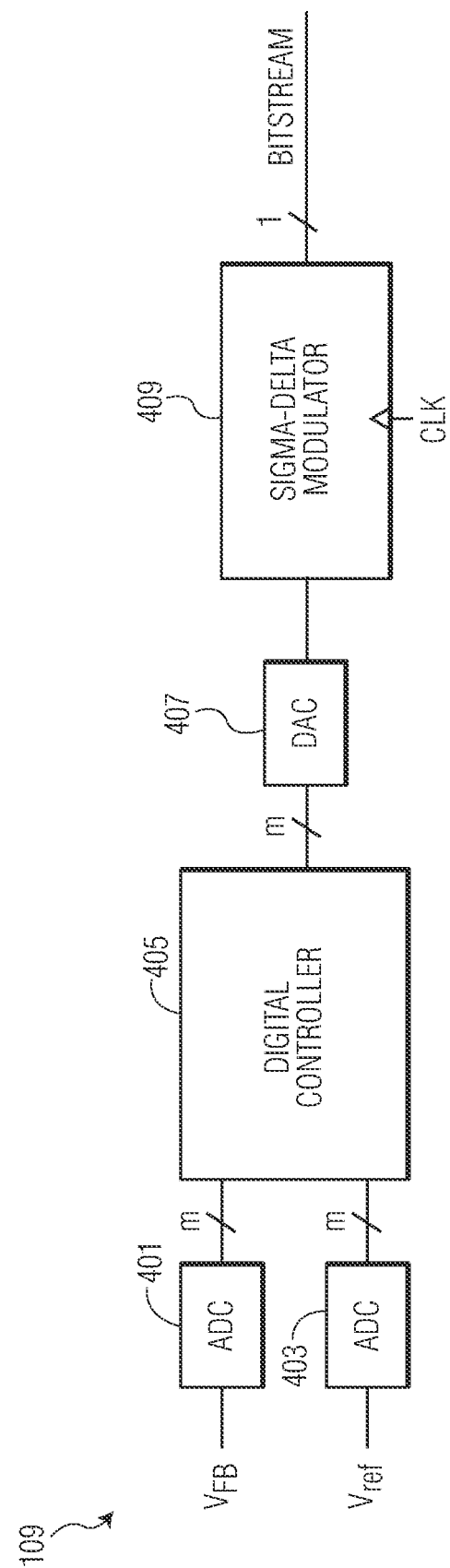
FIG. 4 is a circuit diagram of a converter circuit according to another embodiment of the present invention.
Figure 5:
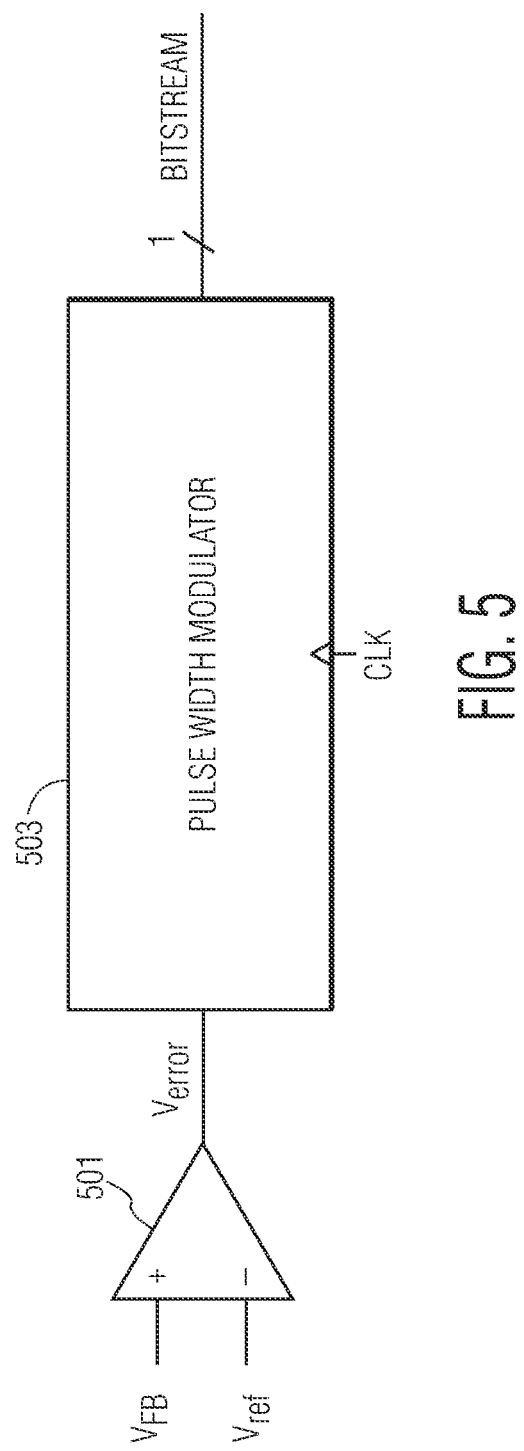
FIG. 5 is a circuit diagram of a converter circuit according to another embodiment of the present invention.

FIGS. 3, 4, and 5 show alternative embodiments of converter circuit 109. In FIG. 3, converter circuit 109 includes an amplifier 301 that receives $V_{FB}$ at its non inverting input and $V_{REF}$ at its inverting input to produce a comparison signal $V_{ERROR}$. Converter circuit 109 includes a Proportional-Integral-Derivative controller (PID 303) for stability compensation. In one embodiment, PID 303 integrates the $V_{ERROR}$ signal and multiplies the integral by a constant to produce a $V_{CONTROL}$ signal that is provided to a sigma-delta modulator 305. Sigma-delta modulator 305 produces a BITSTREAM whose pulse density is controlled by the voltage of the $V_{CONTROL}$ signal. One advantage of using a sigma-delta generator is that it may provide for a lower error in producing the bitstream thereby increasing the accuracy of the regulator and allowing for a simpler averager circuit.

Converter circuit 109 of FIG. 4 includes an analog to digital converter (ADC 401) for providing a digital value of $V_{FB}$ and an analog to digital converter (ADC 403) for providing a digital value of $V_{REF}$. In some embodiments, the digital value of $V_{REF}$ may be provided by a register (not shown) programmed with a reference value. Converter circuit 109 of FIG. 4 includes a digital controller 405 that compares the digital values of $V_{ERROR}$ and $V_{REF}$ and produces a control value that is converted by a digital to analog converter (DAC) 407 to an analog value and provided to sigma-delta modulator 409. In some embodiments, controller 405 may perform operations on the comparison data for stability compensation similar to PID 303 but in the digital domain. One advantage of the converter circuit of FIG. 4 is that its operations may be performed with processing circuity that performs other functions as well, thereby reducing the circuit footprint. Some embodiments do not include DAC 407, where sigma-delta modulator 403 is configured to convert the multi-bit output of digital controller 405 to a serial bitstream.

In FIG. 5, converter circuit 109 includes a pulse width modulator 503 that converts the $V_{ERROR}$ signal to a bitstream that is periodic where the duty cycle of the bitstream is indicative of $V_{ERROR}$. In one embodiment, modulator 503 includes a comparator (not shown) that compares the $V_{ERROR}$ signal with a saw tooth signal produced by a saw tooth generator (not shown). However, a pulse width modulator may be configured in other ways in other embodiments. In some embodiments, the pulse width modulator may receive a digital $V_{ERROR}$ signal, as with the embodiment of FIG. 4. In some embodiments, regulator 101 may not include a voltage divider at its output where $V_{FB}$ is $V_{OUT}$.

Figure 7:
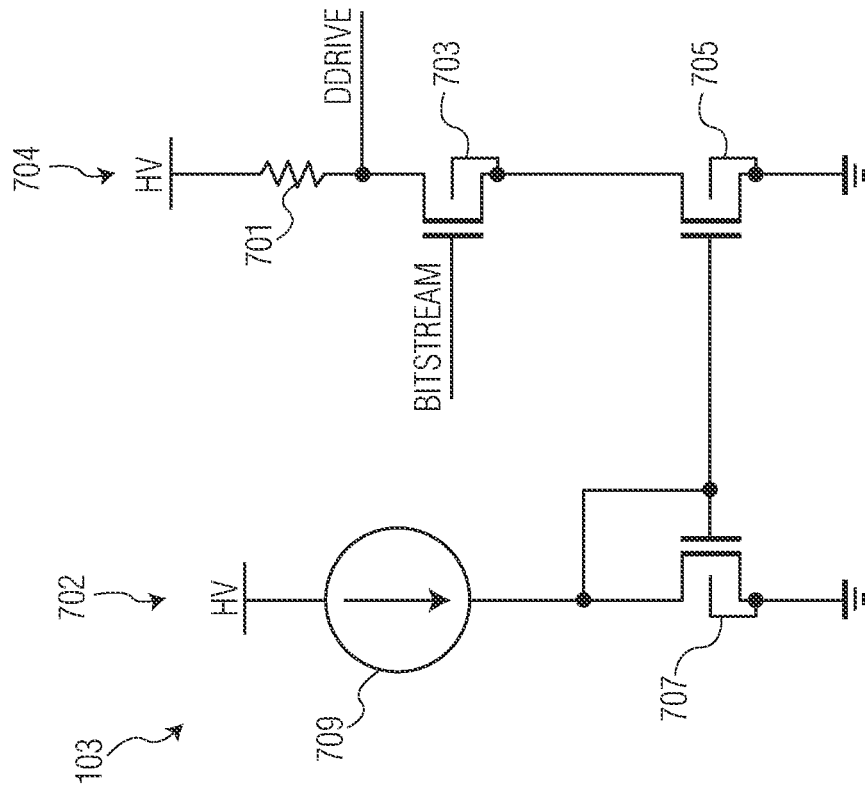
FIG. 7 is a circuit diagram of a level shifting buffer according to one embodiment of the present invention.
Figure 6:
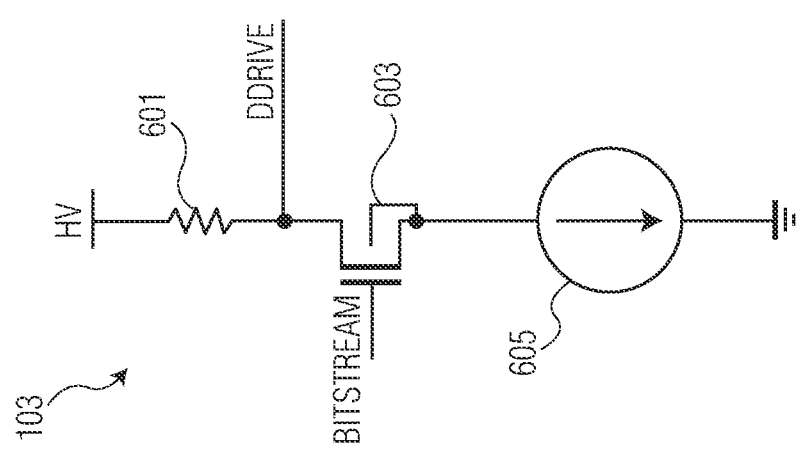
FIG. 6 is a circuit diagram of a level shifting buffer according to one embodiment of the present invention.

FIGS. 6 and 7 are circuit diagrams of alternative embodiments of buffer circuit 103 that produces the DDRIVE signal. The buffer circuits of FIGS. 6 and 7 are characterized as level shifting buffers in that they shift the bitstream from a lower voltage domain (of LV) to a higher voltage domain (of voltage HV) and provide a driver current for the DDRIVE signal. In the embodiment shown, the buffer circuits of FIGS. 6 and 7 also logically invert the bitstream in producing the DDRIVE signal.

In the embodiment of FIG. 6, buffer circuit 103 includes a current source 605 and an N-type transistor 603 which has a gate that receives the BITSTREAM signal. Circuit 103 also includes a resistor 601 connected to the high voltage terminal HV. When the value of the BITSTREAM signal is high, transistor 603 becomes conductive to pull the voltage of the DDRIVE signal to a low voltage value, which is voltage HV minus the voltage drop across resistor 601. When the value of the BITSTREAM signal is low, transistor 603 becomes nonconductive where the voltage of the DDRIVE signal remains close to voltage HV. The voltage drop across resistor 601 is dependent upon the resistance of resistor 601 and the amount of current of current source 605.

Buffer circuit 103 of FIG. 7 includes two current paths (702 and 704) from the HV terminal. Current path 702 includes current source 709 and N type transistor 707. Path 704 includes resistor 701, N-type transistor 703, and N-type transistor 705. Transistors 707 and 705 and a current source 709 are arranged in a current mirror configuration such that the voltage at the gate of transistor 705 is set to provide a mirrored current of the current of current source 709 through transistor 705. When the value of the BITSTREAM signal is high, transistor 703 becomes conductive to pull the voltage of DDRIVE to a low voltage value, which is voltage HV minus the voltage drop across resistor 701. When the value of the BITSTREAM signal is low, transistor 703 becomes nonconductive where the voltage of the DDRIVE signal remains close to HV.

One advantage of the level shifting buffer circuits of FIGS. 6 and 7 is that the buffers perform both functions of providing a drive current and level shifting the BITSTREAM signal, thereby simplifying the design and layout of buffer circuit 103.

Figure 8:
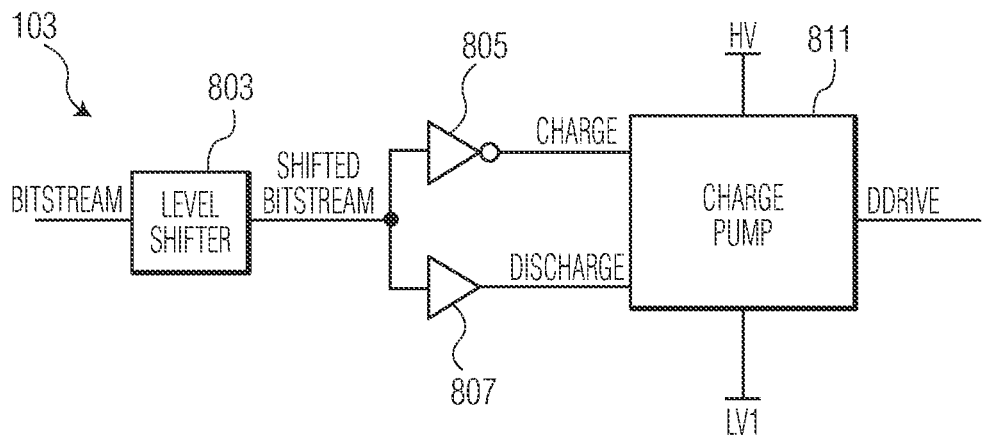
FIG. 8 is a circuit diagram of a buffer according to one embodiment of the present invention.

FIG. 8 is a circuit diagram of another embodiment of buffer circuit 103. The buffer circuit of FIG. 8 includes a level shifter 803, a charge pump 801, buffer 807, and inverter 805. Level shifter 803 converts the BITSTREAM from a lower voltage domain of voltage LV to a higher voltage domain of voltage HV to produce the SHIFTED BITSTREAM signal. The SHIFTED BITSTREAM signal controls whether charge pump 801 charges the DDRIVE signal line from terminal HV when the CHARGE signal is asserted or discharges the DDRIVE signal line to terminal LV1 when the DISCHARGE signal is asserted. Inverter 805 inverts the SHIFTED BITSTREAM signal whereas buffer 807 does not such that the CHARGE signal is asserted when the SHIFTED BITSTREAM signal is at a low voltage state and the DISCHARGE SIGNAL is asserted when the SHIFTED BITSTREAM signal is at a high voltage state. Charge pumps may have other configurations in other embodiments. In some embodiments would not include level shifter 803.

Figure 9:
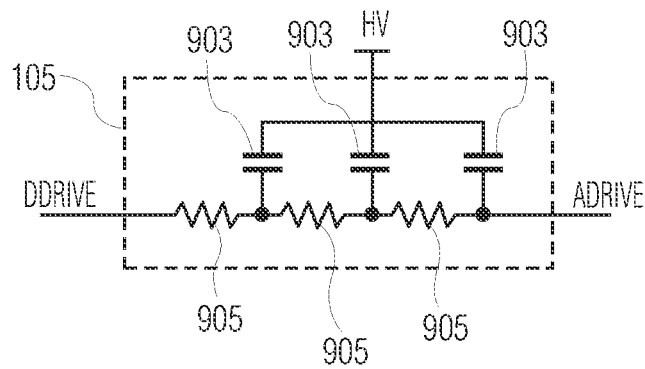
FIG. 9 is a circuit diagram of an averager circuit according to one embodiment of the present invention.

FIG. 9 is a circuit diagram of one embodiment of averager circuit 105. In the embodiment shown in FIG. 9, averager circuit 105 is implemented with a low pass filter. In the particular embodiment shown, the low pass filter includes capacitors 903 and resistors 905. In one embodiment, the use of a low pass filter for the averager circuit 105 can improve electromagnetic capability with power transistor 107. In one embodiment, the low pass filter can include the dominant pole in the feedback control loop for power transistor 107. In other embodiments, regulator 101 may include other filter stages to filter the BITSTREAM signal.

A low pass filter may have other configurations in other embodiments. One advantage of using a low pass filter as an averager circuit is that it may have a simpler implementation and a lower power consumption than an active integrator in some embodiments. In some embodiments, the voltage ripple (see FIG. 2) that may be inherent in the output of some digitally driven linear voltage regulators may be reduced through the selection of an appropriate clock frequency of the CLK signal and appropriate cut off frequency of the low pass filter (see FIG. 9) along with the relatively high resolution of a delta signal modulator to reduce he ripple voltage of $V_{out}$.

In some embodiments, the use of a low pass filter also provides for improve electromagnetic compatibility of the regulator. In some embodiments, the use of nonlinear control techniques can be used to improve transient load response as well.

Figure 10:
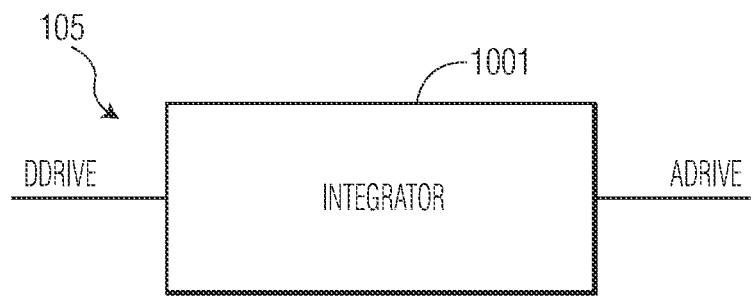
FIG. 10 is a circuit diagram of an averager circuit according to another embodiment of the present invention.

FIG. 10 is a circuit diagram of another embodiment of averager circuit 105. In the embodiment of FIG. 10, averager circuit 105 is implemented with an integrator 1001. Integrator 1001 integrates the voltage level of the DDRIVE signal to produce the voltage of the ADRIVE signal.

Features described with some of the embodiments described herein may be implemented with other embodiments described herein. For example, digital controller 405 may be used in the embodiment of FIG. 5 with pulse width modulator 503. Also, the different embodiments of the buffer circuits 103, averager circuits 105, and converter circuits 109 described herein may be used in any combination with each other in a linear voltage regulator.

Although the transistors (107, 603, 703, 707, 707) in the embodiments shown are implemented with field effect transistors (FETs), they may be implemented with other types of transistors in other embodiments. A source and drain are current terminals for a FET. A gate is a control terminal for a FET.

In one embodiment, a linear voltage regulator includes a power transistor including a first current terminal coupled to a power supply terminal and a second current terminal to supply a regulated voltage. The linear voltage regulator includes a converter circuit including an output to provide a serial bitstream whose pulse density is dependent upon a voltage difference between the regulated voltage and a reference voltage. The linear voltage regulator includes a digital to analog converter circuit that includes an input to receive the serial bitstream. The digital to analog converter circuit includes an averager circuit that produces at an output a control signal to control a voltage of a control terminal of the power transistor for regulating the regulated voltage based on the pulse density of the serial bitstream.

In another embodiment, a method for providing a regulated voltage by a linear voltage regulator includes providing a regulated voltage at a current terminal of a power transistor of a linear voltage regulator and providing a serial bitstream with a pulse density that is dependent upon a difference between the regulated voltage and a reference voltage. The method includes converting the serial bitstream to a signal to control a voltage of a control terminal of the power transistor to regulate the regulated voltage based on the pulse density of the serial bitstream. The signal being provided by an averager circuit.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A linear voltage regulator comprising:
   a power transistor including a first current terminal coupled to a power supply terminal and a second current terminal to supply a regulated voltage;
   a converter circuit including an output to provide a serial bitstream whose pulse density is dependent upon a voltage difference between the regulated voltage and a reference voltage;
   a digital to analog converter circuit that includes an input to receive the serial bitstream, the digital to analog converter circuit includes an averager circuit that produces at an output a control signal to control a voltage of a control terminal of the power transistor for regulating the regulated voltage based on the pulse density of the serial bitstream;
   wherein the digital to analog converter circuit includes a level shifter that shifts the serial bitstream from a first voltage domain to a second voltage domain to provide a level shifted serial bitstream, wherein the averager circuit is implemented in the second voltage domain.

2. The linear voltage regulator of claim 1 wherein the averager circuit is characterized as a low pass filter.

3. The linear voltage regulator of claim 1 wherein the averager circuit is characterized as an integrator.

4. The linear voltage regulator of claim 1 wherein the converter circuit compares a voltage indicative of the regulated voltage with a reference voltage to provide a voltage difference value.

5. The linear voltage regulator of claim 4 wherein the converter circuit includes a proportional integrated differential circuit that receives the voltage difference value and provides a control signal dependent upon the voltage difference value.

6. A linear voltage regulator comprising:
a power transistor including a first current terminal coupled to a power supply terminal and a second current terminal to supply a regulated voltage;
a converter circuit including an output to provide a serial bitstream whose pulse density is dependent upon a voltage difference between the regulated voltage and a reference voltage;
a digital to analog converter circuit that includes an input to receive the serial bitstream, the digital to analog converter circuit includes an averager circuit that produces at an output a control signal to control a voltage of a control terminal of the power transistor for regulating the regulated voltage based on the pulse density of the serial bitstream;
wherein the converter circuit includes an analog to digital converter that provides a first digital signal indicative of the regulated voltage and a digital controller that compares the first digital signal with a second digital signal indicative of a reference voltage to provide a third digital signal indicative of a voltage difference value; wherein the converter circuit includes a second digital to analog converter circuit that converts the third digital signal to an analog signal indicative of the voltage difference.

7. The linear voltage regulator of claim 1 wherein the converter circuit includes a sigma-delta modulator having an output that provides the serial bitstream.

8. A linear voltage regulator comprising:
a power transistor including a first current terminal coupled to a power supply terminal and a second current terminal to supply a regulated voltage;
a converter circuit including an output to provide a serial bitstream whose pulse density is dependent upon a voltage difference between the regulated voltage and a reference voltage;
a digital to analog converter circuit that includes an input to receive the serial bitstream, the digital to analog converter circuit includes an averager circuit that produces at an output a control signal to control a voltage of a control terminal of the power transistor for regulating the regulated voltage based on the pulse density of the serial bitstream;
wherein the digital to analog converter circuit includes a level shifter that shifts the serial bitstream from a first voltage domain to a second voltage domain to provide a level shifted serial bitstream;
wherein the converter circuit includes a pulse width modulator that provides a pulse width modulated signal as the serial bitstream whose duty cycle is dependent upon a voltage difference between the regulated voltage and a reference voltage.

9. A linear voltage regulator comprising:
a power transistor including a first current terminal coupled to a power supply terminal and a second current terminal to supply a regulated voltage;
a converter circuit including an output to provide a serial bitstream whose pulse density is dependent upon a voltage difference between the regulated voltage and a reference voltage;
a digital to analog converter circuit that includes an input to receive the serial bitstream, the digital to analog converter circuit includes an averager circuit that produces at an output a control signal to control a voltage of a control terminal of the power transistor for regulating the regulated voltage based on the pulse density of the serial bitstream;
wherein the serial bitstream is in a first voltage domain and the averager circuit includes an input to receive a serial signal that is produced by a buffer circuit of the digital to analog converter circuit in a second voltage domain that is different from the first voltage domain.

10. A linear voltage regulator comprising:
a power transistor including a first current terminal coupled to a power supply terminal and a second current terminal to supply a regulated voltage;
a converter circuit including an output to provide a serial bitstream whose pulse density is dependent upon a voltage difference between the regulated voltage and a reference voltage;
a digital to analog converter circuit that includes an input to receive the serial bitstream, the digital to analog converter circuit includes an averager circuit that produces at an output a control signal to control a voltage of a control terminal of the power transistor for regulating the regulated voltage based on the pulse density of the serial bitstream;
wherein the digital to analog converter circuit includes an inverter to provide a serial signal to an input of the averager circuit, the serial signal having a pulse density that is dependent upon the voltage difference between the regulated voltage and a reference voltage.

11. The linear voltage regulator of claim 10 wherein the digital to analog converter circuit includes a level shifter that shifts the serial bitstream from a first voltage domain to a second voltage domain to provide a level shifted serial bitstream, wherein the inverter receives the level shifted serial bitstream at its input.

12. A linear voltage regulator comprising:
a power transistor including a first current terminal coupled to a power supply terminal and a second current terminal to supply a regulated voltage;
a converter circuit including an output to provide a serial bitstream whose pulse density is dependent upon a voltage difference between the regulated voltage and a reference voltage;
a digital to analog converter circuit that includes an input to receive the serial bitstream, the digital to analog converter circuit includes an averager circuit that produces at an output a control signal to control a voltage of a control terminal of the power transistor for regulating the regulated voltage based on the pulse density of the serial bitstream;
wherein the digital to analog circuit includes a charge pump for providing a signal to the averager circuit that is based on the pulse density of the serial bitstream.

13. A linear voltage regulator comprising:
- a power transistor including a first current terminal coupled to a power supply terminal and a second current terminal to supply a regulated voltage;
- a converter circuit including an output to provide a serial bitstream whose pulse density is dependent upon a voltage difference between the regulated voltage and a reference voltage;
- a digital to analog converter circuit that includes an input to receive the serial bitstream, the digital to analog converter circuit includes an averager circuit that produces at an output a control signal to control a voltage of a control terminal of the power transistor for regulating the regulated voltage based on the pulse density of the serial bitstream;
- wherein the digital to analog converter circuit includes a buffer circuit that is characterized as a level shifting buffer circuit that receives the serial bitstream and provides a serial signal to an input of the averager circuit, wherein the serial bitstream is in a first voltage domain and the serial signal is in a second voltage domain different than the first voltage domain.

14. The linear voltage regulator of claim 12 wherein the digital to analog converter circuit includes a level shifter that shifts the serial bitstream from a first voltage domain to a second voltage domain to provide a level shifted serial bitstream.

* * * * *